(12) United States Patent
Shrauger (10) Patent No.: US 6,558,976 B2
(45) Date of Patent: May 6, 2003

(54) CRITICALLY ALIGNED OPTICAL MEMS DIES FOR LARGE PACKAGED SUBSTRATE ARRAYS AND METHOD OF MANUFACTURE

(75) Inventor: Vernon Shrauger, Carlisle, MA (US)

(73) Assignee: Analog Devices, Inc., Cambridge, MA (US)

( * ) Notice: Subject to any disclaimer, the term of this patent is extended or adjusted under 35 U.S.C. 154(b) by 0 days.

(21) Appl. No.: 10/090,523

(22) Filed: Apr. 9, 2002

(65) Prior Publication Data

US 2002/0180016 A1 Dec. 5, 2002

Related U.S. Application Data

(62) Division of application No. 09/829,318, filed on Apr. 9, 2001.

(51) Int. Cl.⁷ .............................................. H01L 21/44
(52) U.S. Cl. ..................... 438/106; 385/14; 359/201; 359/224; 359/850; 257/680; 257/729; 257/730
(58) Field of Search ..................... 385/14; 359/201, 359/224, 850; 257/680, 729, 730

(56) References Cited

U.S. PATENT DOCUMENTS 6,097,857 A * 8/2000 Feldman ..................... 385/14

* cited by examiner

Primary Examiner—David Nelms
Assistant Examiner—Mai-Huong Tran
(74) Attorney, Agent, or Firm—Rines and Rines (57) ABSTRACT

A novel array of optically and electrically interacting optical MEMS dies physically and electrically integrally attached upon an optically transmissive preferably (transparent) printed circuit substrate that is monolithically formed with one or more optical components, such as lenses, for providing fixed optical path alignment and interaction therebetween, and with provision for the integration also of active optical components such as lasers and photodiodes and the like.

12 Claims, 7 Drawing Sheets

Die in Place Process
FIG. 4

CRITICALLY ALIGNED OPTICAL MEMS DIES FOR LARGE PACKAGED SUBSTRATE ARRAYS AND METHOD OF MANUFACTURE

This application is a division of U.S. application Ser. No. 09/829,318, filed Apr. 9, 2001 still pending.

FIELD OF THE INVENTION

The present invention relates to the fabrication and packaging of optical microelectro-electromechanical devices (MEMS or MOEMS), carrying tiltable mirrors integrated on substrates; and improved MEMS structures and devices provided thereby, being more particularly directed to the precise alignment or tiling of such devices or dies on single packaging transparent optical substrates and the like, without restriction on the size of, or the layout upon, the substrate, and with ready adaptability for large scaling.

BACKGROUND

The present invention, as above stated, generally relates to the packaging of electronic integrated circuits, and more specifically to the packaging of MEMS devices with optical components, such as tiltable or orientable mirrors; being primarily concerned with the means by which optical and electrical inputs and outputs are made, utilizing packaging substrates, and how such packaging can monolithically employ general-purpose optical components.

Recent attention, however, has been paid to making multichip modules (MCM), systems-on-chip (SOC) and microscale optomechanical devices for a variety of applications. The MCMs are devoted to miniaturization of electronic systems into one packaged module where many hybrid technologies may be employed; while the SOC has focused on the integration of many electronic functions, (analog, digital and RF, etc.), monolithically onto a single VLSI die. Optoelectronic devices are beginning to follow along the MCM route where many optical components, such as lenses, beams splitters, lasers, detectors, and fiber optics and the like, are integrated onto MCM-like carrier substrates.

The present invention falls under the particular purview of the so-called flip-chip (FC) bonded multichip modules (MCM) that employ substrates that act not only as a mechanical attachment and electrical wiring point, but also as an optical interface. Typical MCMs incorporate an insulating or non-conductive substrate resembling a printed circuit board (PCB) where metalization is placed for the creation of interconnection circuitry. The substrates have regions where VLSI dies are attached, face-up to the substrate; and, following attachment to the substrate, are then wirebonded to complete the electrical connection. An example of such structures is disclosed in U.S. Pat. No. 6,147,876, creating a special substrate for die potting. Other forms of substrates, interconnection methodologies, materials, and architectures have also been proposed for face-up VLSI MCMs.

More recently, the previously mentioned flip-chip bonding of dies to substrates and of dies-to-dies for face-to-face solder attachments have also been proposed as in, for example, U.S. Pat. No. 6,150,724, illustrating die-on die/die-on-wafer flip-chip bonding. In such cases, solder is used to attach, align and electrically connect the VLSI to another die or a sub-wafer package. By utilizing surface tension while the solder is in its liquid state, the floating die placed face down onto the target substrate is drawn laterally until minimal misalignment between the target substrate and the die is achieved. Such techniques are shown, as a further example, in U.S. Pat. No. 6,151,173, employing solder microballs to achieve 1 micron alignment. In this case, the solder microballs are utilized to control the solder coating thickness, which plays an important role in alignment accuracy. In the field of MEMS or MOEMS, the use of such flip-chip bonding has been employed to mix differently processed die substrates in order to achieve hybrid integration of MEMS components for an optomechanical device, such as an optical scanner of Xerox Corporation, employing flip chip process for MEMS applications in silicon optical bench integration. In addition, flip-chip bonding has also been used for the self-alignment of optical fiber arrays to substrates that have waveguide components monolithically integrated, as described at http://www.rereth.ethz.ch/phys/quantenelectornik/melchior/pj.17.html. In this case, the surface tension of the solder bond draws the fiber arrays into alignment relative to the substrate.

In much of the prior art, the attach substrate has been opaque or not at all considered for optical interconnection functions or its optical properties. Recently, however, some consideration has been given to the use of the attach substrates as an optical path. VLSI dies with detectors or transmitters, for example, have been bonded to an optical substrate that provides an optical path for interconnection, as illustrated in U.S. Pat. No. 6,097,857, describing optical and electrical interconnections using such a substrate with integrated holograms, wherein VLSI chips are flip-chip bonded to the optical substrate. As another illustration, transmission through a VLSI substrate has also been considered for optical interconnection as in U.S. Pat. No. 6,052,498.

Up until the present invention, however, it does not appear that the prior art has taken into full account the problem of integrating many MEMS dies with high alignment accuracy onto an optically transmissive substrate that provides not only electrical connectivity but also simultaneously provides means to integrate passive or active optical components (as later discussed). MCM and flip-chip approaches heretofore only covered the many die-to-single substrate attachments. One of the purposes of this invention, on the other hand, is to create a substrate that provides both electrical and optical interconnection to optical MEMS-integrated circuits and components requiring critical alignment, say as low as +/−1 micron. The present state-of-the-art of VLSI processing, unfortunately, does not pragmatically provide a mechanism for creating die sizes beyond 20 mm on a side without defects. Sizes exceeding 20 mm on a side, indeed, require stitching of stepper repeated masks—a process that encompasses more defects per area that often result in defective mirrors or electronics, increasing the risk of unacceptable dies and producing wafers with very poor yield.

As a result, very large arrays of MEMS devices, sizes exceeding 40 mm on a side, have not heretofore been possible with the stitched stepper mask approach, for example, on a single silicon die, particularly where the die is approaching the wafer sizes. In addition, the scalability of the MEMS devices, typically on the order of 1 square mm in area, to thousands of devices, is currently seriously limited. To combat these problems, known good—die approaches have been the industry standard; that is, VLSI dies and correspondingly MEMS dies, are tested, and only known good parts are selected out for packaging. To effectively use known good dies in the creation of a larger optical MEMS array, however, a precise alignment of MEMS die-to-MEMS die is necessary in order to maintain beam integrity, requiring a high-accuracy tiling approach. In addition, while lens arrays can be used over the MEMS array to reduce the overall size of the MEMS and increase the amount of real estate available for integrated electronics and interconnections, a critically tight alignment of the lens arrays to the center of the MEMS mirror is required to avoid misfocusing of the optical beams.

In accordance with the present invention, these and other problems of tiling many MEMS have now been successfully addressed by using a custom-fabricated optically (for example, visible or near-infrared band) transmissive substrate. This substrate may have monolithically integrated optical components, such as lenses, diffractive gratings, optical absorbers, and transmission filters, and the like; and its MEMS chips are flip-chip-bonded onto support pillars or posts that act as the electrical and mechanical connections and also provide the mechanism for self-alignment. Instead of creating MCMs with standard VLSI dies and an optical substrate, or MCMs on non-optical substrates, the technique of the present invention rather builds an optical MCM (OMCM) with MEMS devices. This invention allows for physically integrated means to set the optical path, as for a lens which focuses light onto the MEMS mirror. By using lenses to optically address the MEMS arrays, smaller mirrors are then possible, enabling greater area for monolithic electronics integration. By using a self-aligned flip-chip approach in this manner, moreover, the MEMS are accurately aligned to these passive optical components. The invention, furthermore, does eliminate the need for attaching monolithic lens arrays to the MEMS device following the packaging process; but it does require careful handling of the released MEMS dies during the bonding process, and careful control of the solder bonding process to assure 100% yield of the bonded dies, as later more fully explained.

OBJECTS OF INVENTION

A primary object of the invention, accordingly, is to provide new and improved critically aligned optical MEMS dies particularly suitable for large packaged substrate arrays, and that shall not be subject to the above-described prior art limitations and difficulties; but that, to the contrary, enable large packaged array constructions through the integrated packaging of MEMS devices with optical components, such as lenses, wherein electrical and optical inputs and outputs are integrally provided upon an optical substrate monolithically embodying such optical components.

A further object is to provide such novel structures and devices wherein an integrated physical optical path is provided for the lenses which focus light onto the MEMS mirrors and optically address the MEMS array, thereby enabling the use of small mirrors and providing greater area for monolithic electronics integration in the substrate.

An additional object is to provide a new and improved method of manufacturing such novel devices.

Other and further objects will be explained hereinafter and are more particularly delineated in the appended claims.

SUMMARY

In summary, the invention embraces an assembled array of optically and electrically interacting optical MEMS dies physically and electrically integrally attached upon a light-transmissive substrate carrying a pattern of printed electrical circuit interconnections, whether transmissive, opaque or a combination of both properties, for operating the dies, the light-transmissive substrate being integrated monolithically with optical components (passive and/or active) to provide accurate and fixed optical alignment of the MEMS and the optical components interacting therewith.

In its fabrication aspects, the invention provides a method for enabling the precision assembly of optical MEMS arrays upon a single substrate without substantial restriction on the size or layout of the substrate, that comprises, custom-forming a plurality of MEMS dies each carrying electrical signal-controllable mirrors; and forming a light-transmissive substrate of desired size to accommodate the plurality of MEMS dies, while monolithically integrating into the light-transmissive substrate, optical components useful for light-path interfacing with the MEMS dies. Integral printed electrical circuit interconnections are provided on the substrate for operation of the mirrors of the dies and the dies are physically and electrically integrally attached along and upon the single optically transmissive substrate, and with electrical connection to the printed circuit, thereby to provide also for the accurate and fixed optical alignment of the MEMS dies and the optical components optically interacting therewith, and enabling the focusing of light onto the MEMS mirrors along fixed optical paths for optically addressing the array without requiring adjustments.

A scalable approach is thus provided for packaging the optical microelectro-electromechanical system devices onto the light-transmitting, (preferably optically transparent) printed wiring or circuit substrate. This approach allows for the creation of custom-defined optical paths, by a lens array, antireflecting and/or absorbent surfaces, optical grating surfaces, wavelength specific filters, etc. The substrate contains photolithographically defined metalization or conductors that represent the desired electrical printed circuit interconnections of the many MEMS dies, once integrally bonded to the substrate. These printed circuit conductors are defined with well-known high-resolution lithography tools allowing for inter-MEMS die conductor placement accuracy of less than 1 micron. The mounting substrate accepts separately custom-manufactured MEMS dies that are bonded physically and simultaneously electrically connected to the substrate using the before-mentioned present state-of-the-art flip-chip solder attach tools. Solder reflow techniques are preferably employed precisely to align MEMS dies to the transparent optical substrate. This precise alignment process maintains tight alignment of the MEMS devices relative to the substrate, and, indeed, provides for MEMS die alignment as low as +/−1 micron, and similar tight alignment for the optical components monolithically integrated into the packaging substrate. The overall device package of the invention thus allows for the precise placement and tiling of many MEMS dies onto a single substrate without restriction on the size or layout of the substrate.

Preferred and best mode designs, techniques and configurations are hereinafter more fully explained.

DRAWINGS

The invention will now be described in connection with the accompanying drawings in which.

DESCRIPTION OF PREFERRED EMBODIMENT OF INVENTION

Figure 1:
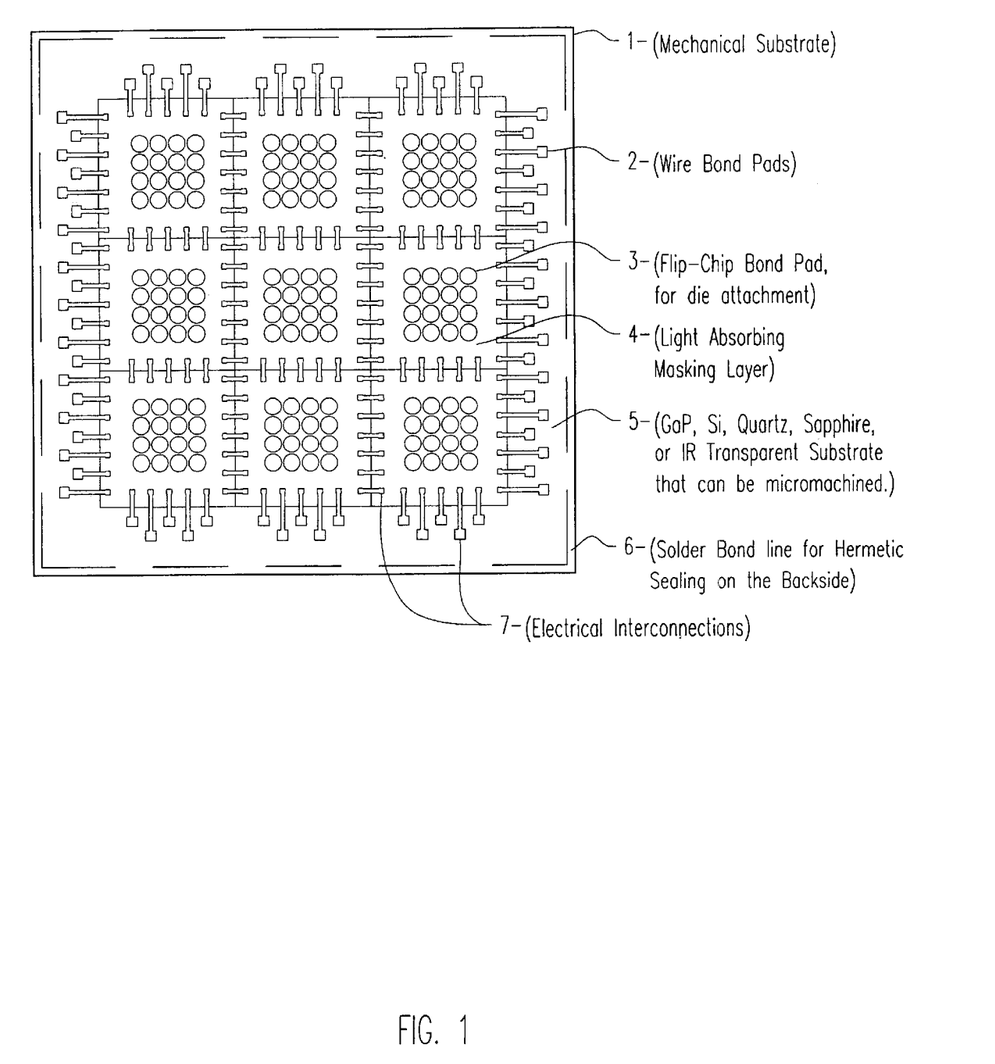
FIG. 1 is a top view of an illustrative transparent substrate of preferred format and a preferred method of fabrication or manufacture, showing an exemplary optical path and electrical connection integrated package.

To achieve the previously described feature of tight alignment of known-good MEMS dies, a mechanical substrate 1 is employed, FIG. 1, that is optically transparent in the wavelength range of interest and has electrical interconnections 7 patterned onto or into it. The substrate thickness is selected appropriately for the mechanical stability over the desired operating temperature range and packaging housing, being very similar to an insulated printed circuit board (PCB) with the exception that the substrate is light transmissive. It has been patterned photolithographically, as shown, with 5-micron conductor line widths and pattern placement to at least 2-micron accuracy across the printed-circuit patterned substrate. The pattern is created with standard VLSI or high-resolution PCB tools, as is well-known. At manufacturing time, the substrate can also be coated with an anti-reflection coating and an absorbing layer 4 to block stray light that may impinge upon the substrate or scatter off the MEMS mirrors, later described, or off the electronics.

Figure 2:
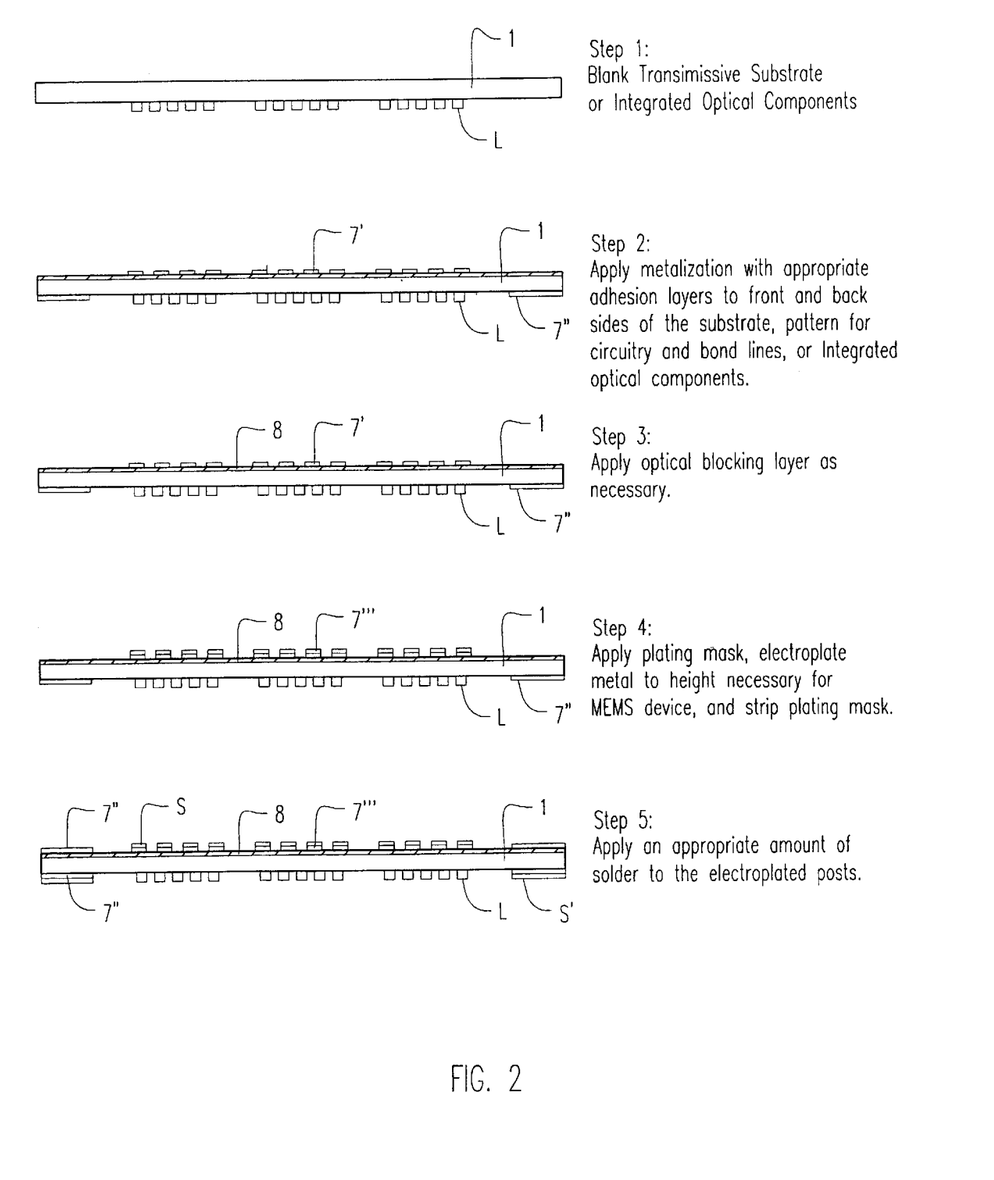
FIG. 2 is a process flow diagram illustrating five successive manufacturing steps in transverse section for the creation of the preferred type of optically transmissive substrate for the MEMS die attachments in accordance with the present invention.

FIG. 2 illustrates a preferred method of manufacture of the substrate, as a combined structural and process flow diagram. This process is representative of a 2-layer metalization, front and backside process, but multi-layer metalization is possible with increased complexity. As shown in FIG. 2, the initial substrate is simply a flat optically transparent plate or blank $1^1$, processed preferably also to include lens arrays L or other optical elements or components machined into and thus integrated with the substrate, ("Step 1"), either on its frontside, backside, as illustrated, or both.

Figure 7:
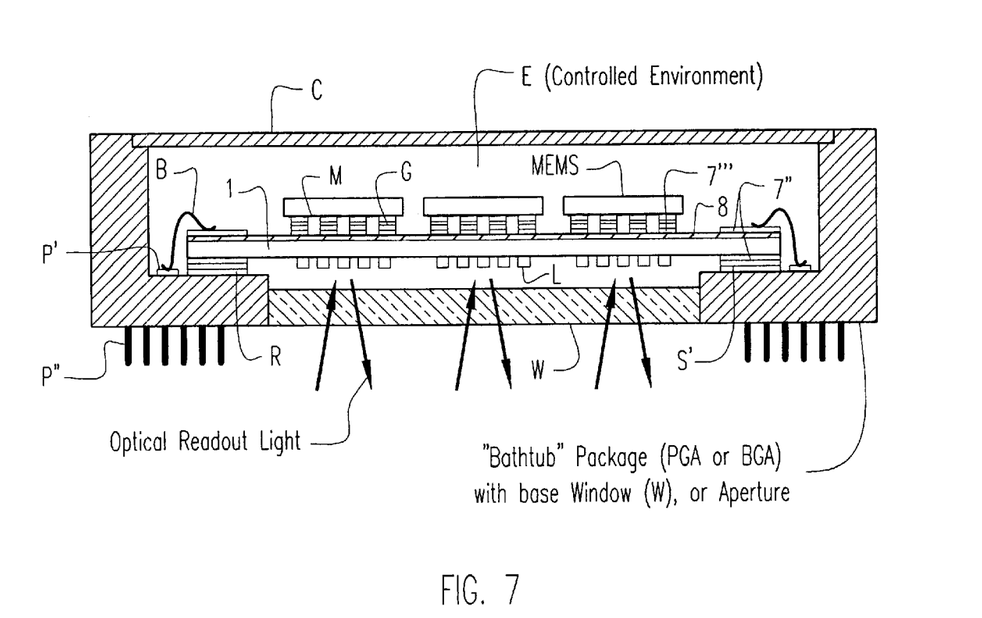
FIG. 7 shows the completed packaging process for the tiled optical MEMS dies with the transparent substrate, including illustrative monolithically integrated lens arrays.

When the later-described MEMS device is read out in reflection, as shown in FIG. 7, optical transmission through the carrier substrate 1 should be minimally lossy to assure maximum optical power after passing through the completed and packaged assembly. This substrate may be of gallium phosphide (GaP), silicon (Si) or other semi-conductor surfaces, sapphire, a glass composite or quartz, or any other material system that is transparent to the optical spectrum of interest and well-matched to the coefficient of thermal expansion of the silicon-based MEMS die. For example, the substrate selected may be transparent to infrared radiation in the 1.3 to 1.55 micron wavelength band. The near matching of the coefficient of thermal expansion between the MEMS die and that of the substrate 1 is critical to ensure reliable die attach over time, and to minimize the likelihood of damage to the MEMS die or substrate over time and temperature cycling. To minimize the interface reflection, the substrate may be coated with appropriate anti-reflection materials prior to the subsequent metalization processes.

As illustrated in "Step 2" in FIG. 2, the electrical circuit pattern 7' is initiated by coating both surfaces with appropriate adhesion layers and conductors, such as (optically opaque) gold. This initial gold layer is thin but sufficiently thick for post-assembly wire bonding. The backside of the substrate is metalized at 7" to form a solid annular region at the periphery of the substrate. This annular region is included for solder attachment of the optical substrate to the package housing as illustrated in FIG. 7. This solder attach methodology facilitates hermetic sealing of the package. If desired, an optical blocking layer 8 may be applied following the initial metal layer coating, shown as "Step 3" in FIG. 2, and in areas around the metalization. To facilitate the attachment and self-alignment of the MEMS die, posts or pillars 7''' are electroplated from the initial gold seed layer 7' ("Step 4") through an apertured plating mask. The gold or an alternative metal is plated to a height H sufficient for the clearance of the out-of-plane moving components (mirrors M) of the MEMS die. An example of sufficient clearance for moving MEMS mirrors M is shown in FIG. 7. Following the post or pillar plating process, the mask is stripped, and the substrate is prepared for solder application, "Step 5". The solder is applied to both sides S, $S^1$ of the substrate in preparation for the die attach process and the subsequent bonding of the flip-chip assembly into the package housing.

Figure 3:
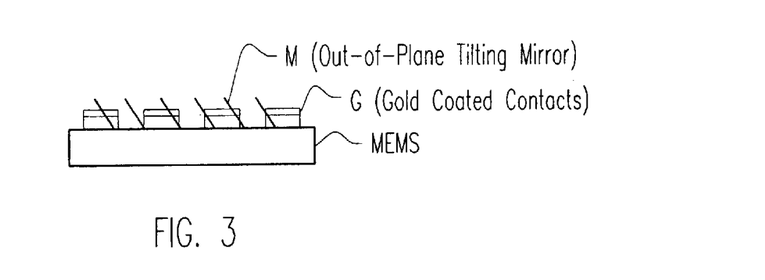
FIG. 3 is a transverse section upon an enlarged scale showing the MEMS mirror array after dicing from the fabricated wafer.

In a preferred system of the invention, the before-mentioned MEMS mirror array (MOEMS) is prepared having electrical signal-controlled orientable or tiltable gimbaled mirrors M that, as is well-known, can move out of plane as shown in FIG. 3. The MEMS die is prepared for solder attach prior to dicing by applying adhesion and gold diffusion block layers below the gold metalization, which will interface the solder from the carrier substrate, as later discussed in connection with FIG. 4. After the MEMS device is diced as shown in FIG. 3, the mechanical structures are released, and care must be taken when handling the die substrate with the subsequently used flip-chip bonding tool.

Figure 4:
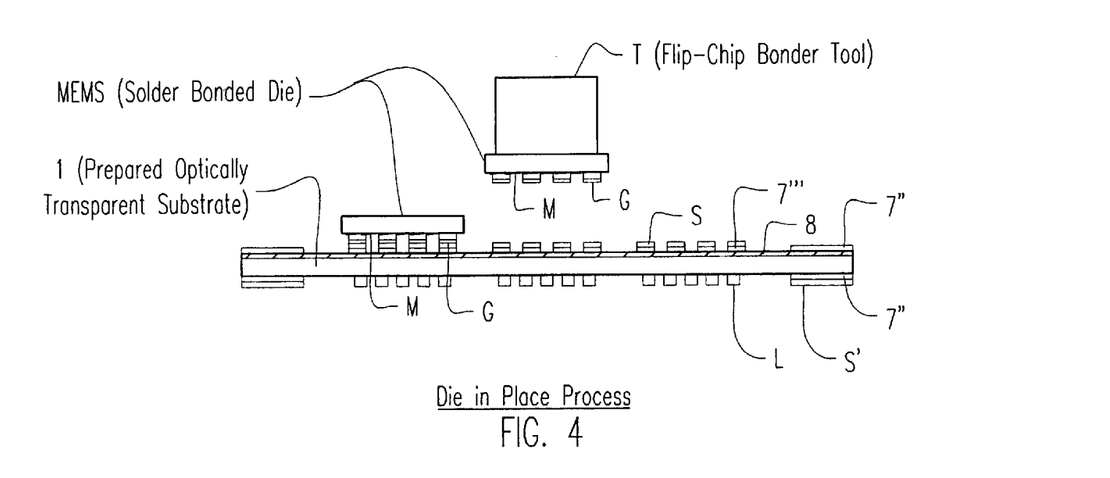
FIG. 4 illustrates the process of flip-chip attaching the MEMS die array of FIG. 3 to the optically transparent substrate of FIGS. 2 and 1.

To assemble the optical MCM (OMCM), the MEMS die, shown face-up in FIG. 3, is flipped upside-down to face the optically transparent substrate 1 shown in FIG. 4. To achieve the tight alignment refinements of the invention, a commercially available flip-chip bonding tool T is used to pick and place the known-good MEMS die accurately on the grid defined by the substrate 1. This machine places each die in close proximity of the substrate pads 3, FIG. 1, and solders them into place to within +/−1 micron accuracy. The flip-chip bonder thus tiles the MEMS dies sequentially until the carrier substrate assembly is complete. Once the dies are bonded to the substrate, the entire assembly is either complete or may be annealed to complete the die attach process.

Figure 5:
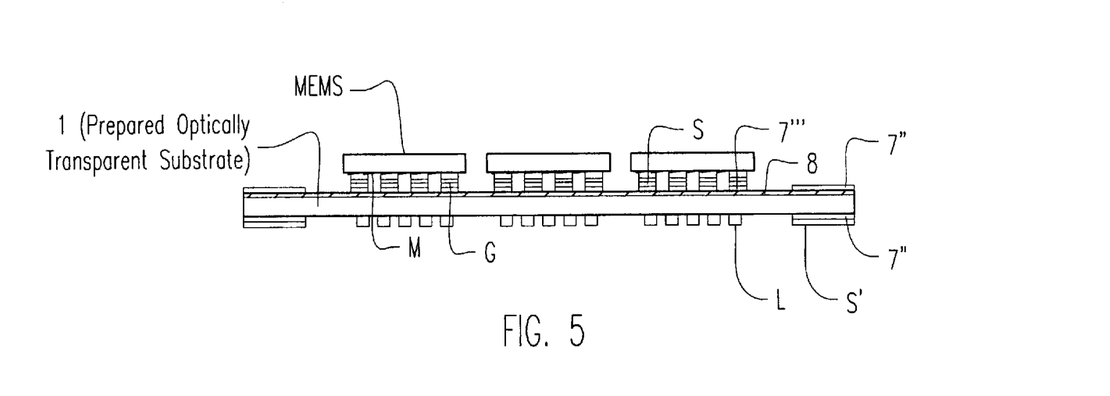
FIG. 5 is a similar diagram illustrating the completed flip-chip assembled dies of FIG. 4 integrally attached on the transparent optical path substrate, OMCM, of both FIGS. 1 and 2.

The completed assembly on the transparent substrate 1 is shown in FIG. 5. In this attach process, solder materials are selected such that all reflow and attach temperatures are mutually compatible.

Figure 6:
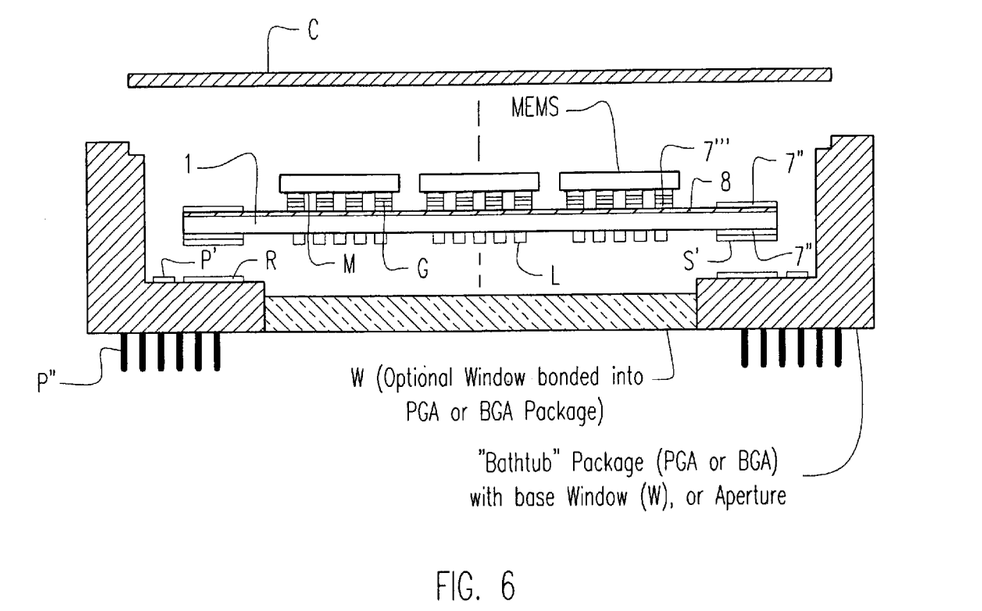
FIG. 6 is an assembly showing of the OMEM of FIG. 5 placed into a modified PGA package.

Once complete, FIG. 5, the OMCM is placed into a pin grid array (PGA) or ball grid array (BGA) package, so labeled, specifically modified with an aperture or window W in the bottom of the package. This PGA, BGA or other suitable package is modified so that light can pass through the bottom of the package as by machining a hole into the central area of the package backside, as shown in cross-section in FIG. 6. This hole may be fitted with a window W and hermetically sealed into the package; or the aperture may be left open, and the OMCM substrate used to sealed the package cavity. In the case where a window W is utilized, this window would preferentially be antireflection-coated on both sides to minimize spurious reflections. In the open aperture case, the OMCM substrate can act as a window into the package; or, in the separate window case, as shown in FIG. 6, with the OMCM substrate acting purely as a transparent carrier. The substrate may also include a solder ring on its backside to create the lower hermetic sealing ring to the package; or, if desired, the OMCM substrate may be bonded in place with a low outgassing epoxy. The package is ultimately sealed with a metallic lid that preferably includes a desiccant and getters on the surface; or, alternatively, the package may be sealed with a controlled environment gas such as dry nitrogen or dry air.

Once the OMCM is bonded into the package (PGA or BGA), the substrate is electrically connected to the annular package pads P' to complete the electrical connection between the OMCM and PGA, BGA or other package. The preferred method of interconnect is wire bonding of the OMCM pads to the annular package pads $P^1$ at B, as by means of an automated wirebonder. An alternate electrical connection methodology to such wire bonding may include solder ball attachment from the backside of the OMCM to the corresponding package pads. This alternate method, however, is of increased complexity, requiring electrical connections through the OMCM and additional solder joints on the backside of the OMCM substrate. The package assembly process is completed by soldering the cover metal cap plate C in place, as indicated in FIG. 6, the completely assembled package being shown in FIG. 7. The cover C is soldered in-place in a controlled ambient environment E to minimize the inclusion of water vapor, and/or getters may be included for residual vapor absorption.

The completed and packaged MEMS OMCM shown in FIG. 7 may be mounted onto a standard PCB or flexible cable connector avoiding optical access occlusion. The electrical connections are in this instance on the bottom side of the package. The MOEMS devices are shown in FIG. 7 as optically readout in reflection from the backside surface.

Figure 8:
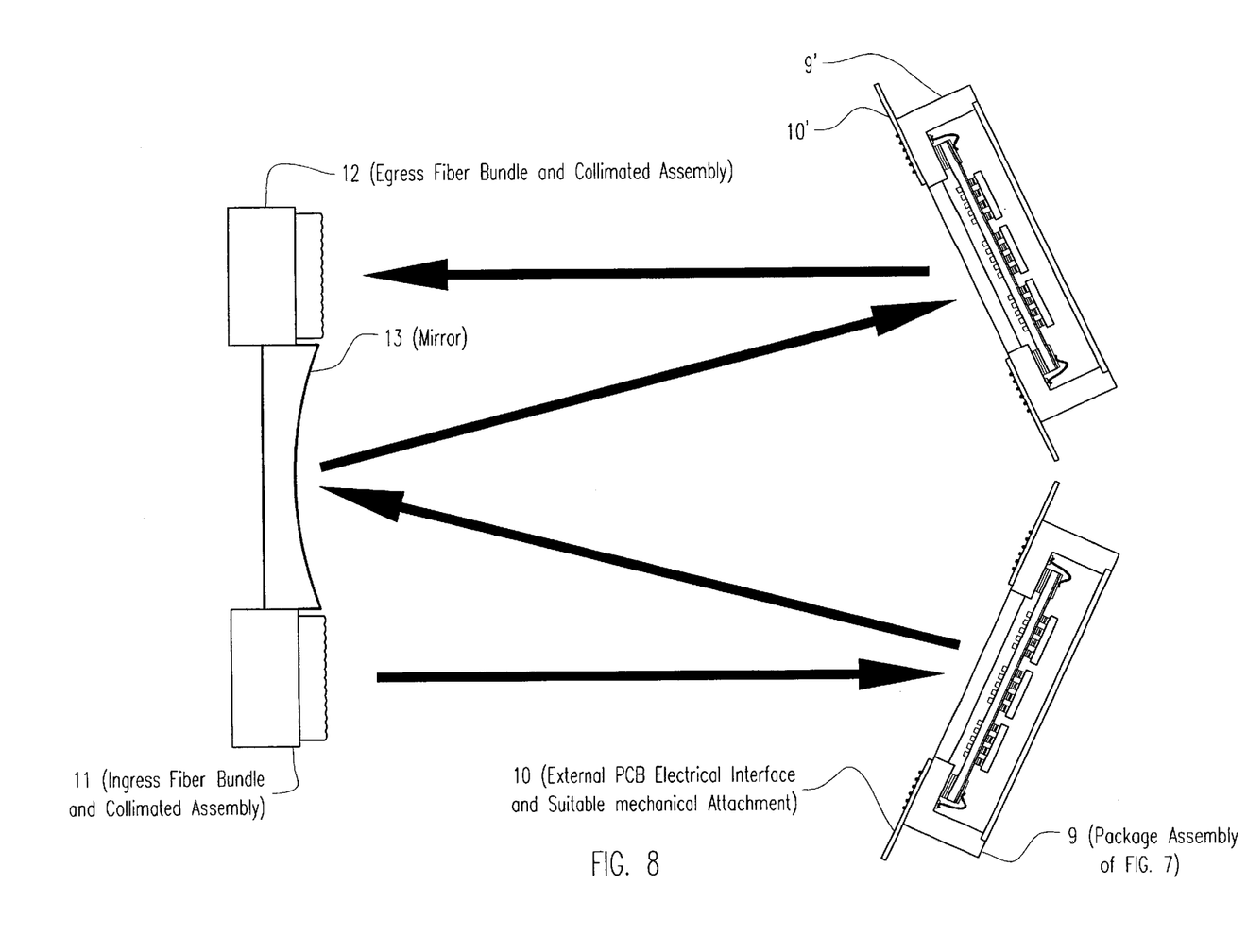
FIG. 8 illustrates the application of the packages of FIG. 7 to an exemplary optical cross-connect architecture.

FIG. 8 shows an exemplary application of the packages of FIG. 7, being illustrated as applied to critically aligned optical MEMS dies in an optical cross-connect architecture (OXC) for telecommunications. To move flight from one fiber to another in an optically dense fashion, three-dimensionally steering MEMS mirrors have been employed in a common OXC architecture (see, for example, WO 00/20899 Xros, Inc. published patent application). The many channels of collimated input light propagate from ingress fiber bundle 11 to the first packaged OMCM array 9. This OMCM is interfaced electrically to control electronics via a printed circuit board 10 which is preferably soldered to the OMCM. The OMCM is suitably mechanically attached to the OXC housing via an external PCB electrical interface and suitable mechanical attach 10, or tooled lugs in 9 (not shown). Light reflects off the MOEMS in the packaged OMCM 9 and reflects off the mirror surface 13 to be redirected towards the second OMCM array $9^1$. The light is further directed toward the egress fiber bundle 12 by reflection off the MOEMS mirrors packaged in OMCM $9^1$. By appropriately controlling the MOEMS mirrors, light can be selectively switched from one fiber in the ingress fiber bundle 11 to a fiber in the egress fiber bundle 12.

Figure 9:
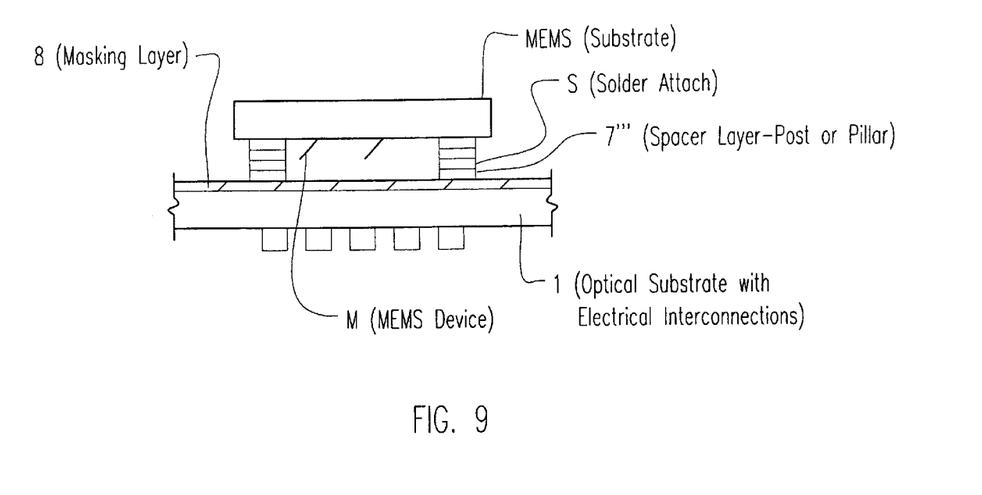
FIGS. 9–12 show the integration of active optical elements into the structures of the invention, illustrating the integration of photodiodes with the MEMS substrate and onto the OMCM substrate, illustrating the integration of photodiodes with the MEMS substrate and onto the OMCM substrate, illustrating the integration of photodiodes with the MEMS substrate and onto the OMCM substrate, and VCSELs onto the surface of the MEMS device wafer, and onto the OMCM substrate, respectively.
Figure 10:
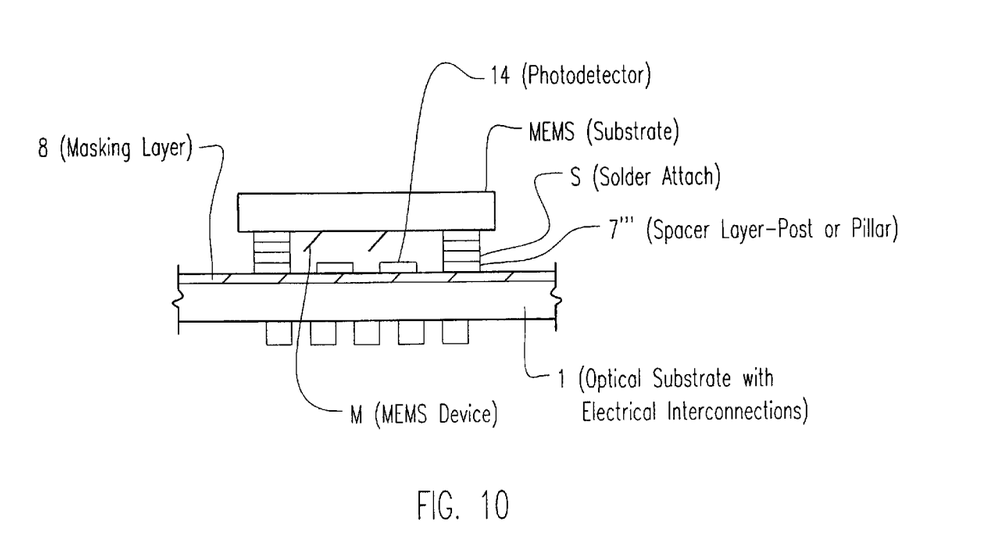

The OMCM approach of the invention, moreover, allows for the integration not only of passive optical elements, but interacting active optical elements, as well. Passive optical elements include, for example, the before-described lenses, diffractive optical elements, arbitrary phase elements, optical masks, mirrors, polarizers, etc. In addition to such and other passive elements, active optical components can well be integrated onto or into either the MEMS substrate or the OMCM substrate. The active optical components may be lasers, photodetectors, modulators, switches, and filters, as examples. MEMS devices are typically integrated on silicon substrates that readily allow for the cointegration of MEMS and photodetectors onto a single MEMS substrate, as illustrated in FIG. 9. In this figure, a photodetector 14 is integrated into the MEMS substrate either laterally placed with respect to the MEMS device M or as part of the MEMS device. In this case, the OMCM substrate acts as a masked window 8. An alternative to this configuration is where the photodetector is integrated onto or within the OMCM substrate, as illustrated in FIG. 10. In this case, the OMCM substrate may act as a window for the photodetector, or it positions the photodetector relative to the MEMS device M to collect light reflected from the MEMS device.

Figure 11:
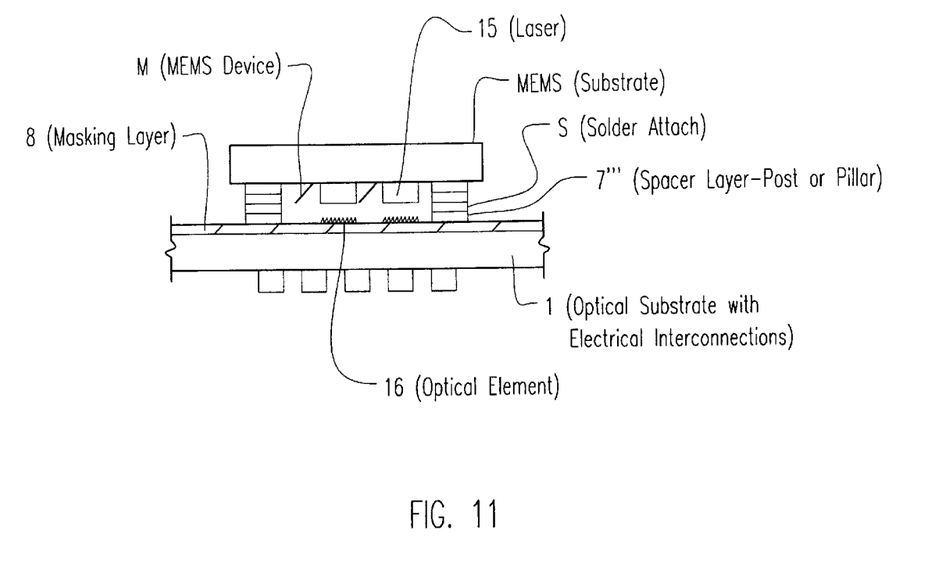
Figure 12:
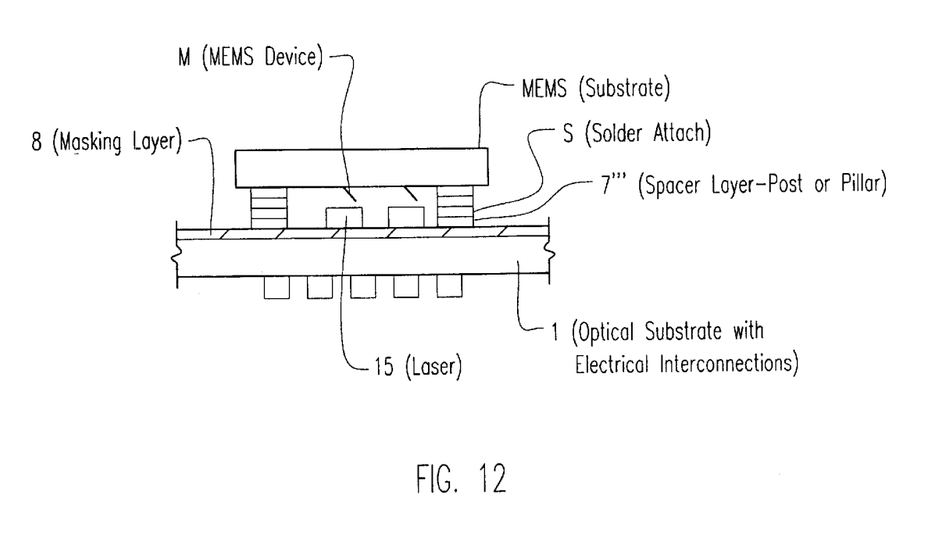

Other active devices useful with the invention include lasers, such as vertical cavity surface emitting lasers, VCSELs. VCSELs may be mounted to the MEMS substrate as in FIG. 11, or to the OMCM substrate, as in FIG. 12, with the before-described well-known bonding processes. As illustrated in FIG. 11, the VCSEL 15 is attached to the MEMS substrate. The light from the laser 15 propagates to the OMCM substrate $1^1$ and may either pass directly through or interact with an optical element 16. In this case, the optical element 16 is a blazed mirror grating to reflect light to the MEMS device M. This example creates a compact optical scanner. An alternative means for the integration of such VCSELs with the OMCM is illustrated in FIG. 12. In this case, the VCSELs are integrated onto the OMCM substrate $1^1$. The light from the VCSEL can either propagate through the OMCM substrate $1^1$ or towards the MEMS device M and reflects off M under its control.

Further modifications in the manufacturing techniques and in the structural details will occur to those skilled in this art, including alternatives above suggested—and such are considered to fall within the spirit and scope of the invention as defined in the appended claims.

What is claimed is:

1. A method for enabling the precision assembly of optical MEMS arrays to a single substrate without substantial restriction on the size or layout of the substrate, that comprises, custom-forming a plurality of MEMS dies each carrying electrical signal-controllable mirrors; forming a light transmissive substrate of desired size to accommodate the plurality of MEMS dies, and monolithically integrating into the light-transmissive substrate, optical components useful for light-path interfacing with the MEMS dies; providing integral printed electrical circuit interconnections on the substrate for operation of the mirrors of the dies; physically and electrically integrally attaching dies along and upon the single optically transmissive substrate and with electrical connection to the printed circuit, thereby to provide also for the accurate and fixed optical alignment of the MEMS dies and the optical components optically interacting therewith, enabling the focusing of light onto the MEMS mirrors along fixed optical paths for optically addressing the array and without requiring adjustments.

2. The method of assembling an array of optically and electrically interacting optical MEMS dies, that comprises, physically and electrically integrally attaching the dies in a predetermined order or pattern along and upon a light-transmissive substrate carrying a pattern of printed electrical circuit interconnections for the dies; and monolithically integrating into the substrate, optical components for interacting light with the dies and to provide accurate and fixed optical alignment of the MEMS and the optical components optically interacting therewith.

3. The method of claim 2 wherein said optical components are passive and/or active optical elements.

4. The method of claim 3 wherein said optical components are active optical elements such as lasers and photodiodes and they are integratable onto or into said dies.

5. The method of claim 2 wherein the optical components comprise lenses and the optical MEMS dies carry electrical signal-controllable mirrors, and focusing light by said lenses along fixed optical paths for optically addressing the array.

6. The method of claim 5 wherein the MEMS dies are provided with metalization between the mirrors; and flip-chip solder-bonding conductive posts provided in the printed circuit of the substrate, leaving sufficient clearance between the substrate and the mirrors to avoid interference with the operation of the mirrors.

7. The method of claim 6 wherein a patterned optical blocking layer is applied to the substrate in areas surrounding said conductive posts.

8. The method of claim 5 wherein the lenses are integrally formed on the top or bottom surface of the substrate, enabling optical readout of the MEMS in reflection from the bottom surface.

9. The method of claim 5 wherein the backside of the substrate is provided with a solid annular peripheral metalized region solder-attachable as to an external pin or ball grid array package housing.

10. The method of claim 9 wherein a package housing is provided and the assembled array is bonded therewithin with the substrate electrically connected to package pads disposed annularly within the housing.

11. The method of claim 10 wherein the top of the substrate is provided with peripheral conductive pads, and wire bonding the conductive pads internally of the packaged housing to said package pads.

12. The method of claim 10 wherein the top or bottom of the package housing is apertured or windowed, and optical readout light for the array mounted within the package is transmitted therethrough.

* * * * *